(12) United States Patent
Ding et al.

(10) Patent No.: US 8,188,808 B2
(45) Date of Patent: May 29, 2012

(54) COMPACT ON-CHIP BRANCHLINE COUPLER USING SLOW WAVE TRANSMISSION LINE

(75) Inventors: Hanyi Ding, Essex Junction, VT (US);
Essam Mina, Essex Junction, VT (US);
Guoan Wang, Essex Junction, VT (US);
Wayne H. Woods, Jr., Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 220 days.

(21) Appl. No.: 12/542,958

(22) Filed: Aug. 18, 2009

(65) Prior Publication Data

US 2011/0043299 A1   Feb. 24, 2011

(51) Int. Cl.
*H01P 5/18* (2006.01)
*H01P 9/00* (2006.01)
(52) U.S. Cl. .................................. 333/116; 333/161
(58) Field of Classification Search .................. 333/109, 333/110, 111, 112, 116, 117, 140, 238, 161
See application file for complete search history.

(56) References Cited

U.S. PATENT DOCUMENTS

| | | | | |
|---|---|---|---|---|
| 4,178,568 | A | * | 12/1979 | Gunton ......................... 333/116 |
| 4,928,078 | A | * | 5/1990 | Khandavalli ................. 333/109 |
| 6,242,992 | B1 | | 6/2001 | Lakin |
| 7,741,929 | B2 | * | 6/2010 | Hash ............................ 333/116 |

OTHER PUBLICATIONS

Sun et al., "A Compact Branch-Line Coupler Using Discontinuous Microstrip Lines", IEEE Microwave and Wireless Components Letters, vol. 15, No. 8, Aug. 2005, pp. 519-520.
Tilmans et al., "MEMS for wireless communications: 'from RF-MEMS components to RF-MEMS-SiP'", Institute of Physics Publishing, Journal of Micromechanics and Microengineering, 2003, pp. S139-S163.
Ponchak, "RF Transmission Line on Silicon Substrates", $29^{th}$ European Microwave Conference, Munich 1999, pp. 158-161.
Martel et al., "Equivalent Circuits for MIS Microstrip Discontinuities", IEEE Microwave and Guided Wave Letters, vol. 3, No. 11, Nov. 1993, pp. 408-410.
Pozar, "Microwave Engineering", Copyright 1998, Chapter 8, pp. 378-383.
Sakagami et al., "A Reduced Branch-Line Coupler With Eight Stubs", 1997 Asia Pacific Microwave Conference, pp. 1137-1140.
Chiang et al., "Design of a Wide-Band Lumped-Element 3-dB Quadrature Coupler", IEEE Transactions on Microwave Theory and Techniques, vol. 49, No. 3, Mar. 2001, pp. 476-479.
Lee et al., "Perforated microstrip structure for miniaturizing microwave devices", Electronics Letters, Jul. 18, 2002, vol. 38, No. 15, pp. 800-801.

* cited by examiner

*Primary Examiner* — Dean O Takaoka
(74) *Attorney, Agent, or Firm* — David Cain; Roberts Mlotkowski Safran & Cole, P.C.

(57) ABSTRACT

Branchline coupler structure using slow wave transmission line effect having both large inductance and large capacitance per unit length. The branchline coupler structure includes a plurality of quarter-wavelength transmission lines, at least one of which includes a high impedance arm and a low impedance arm. The high and low impedances are relative to each other. The high impedance arm includes a plurality of narrow cells and having an inductance of nL and a capacitance of C/n, and the low impedance arm includes a plurality of wide cells and having an inductance of L/n and capacitance of nC. The wide and narrow cells are relative to each other, and the wide and narrow cells are adjacent each other to form a signal layer having step discontinuous alternative widths.

19 Claims, 12 Drawing Sheets

COMPACT ON-CHIP BRANCHLINE COUPLER USING SLOW WAVE TRANSMISSION LINE

FIELD OF THE INVENTION

The invention relates to an on-chip branchline coupler, and in particular to an on-chip branchline coupler on slow wave structures with CMOS fabrication technology using multi-layer.

BACKGROUND

Since the availability of 7 GHz of unlicensed spectrum around 60 GHz for wireless personal area wireless network and directional link applications, 77 GHz for adaptive cruise control radar and 94 GHz for image applications, there is growing interest in using this resource for new consumer applications requiring very high-data-rate wireless transmission. The rapid growth of wireless communication is generating demand for integrated planar components to meet various needs, such as size shrink, performance improvement, and cost reduction. Multi-layer configuration makes microwave and RF circuits more compact. This, in turn, opens more opportunity for their use in portable equipments, as well as offering design flexibility.

There have been strong interests in integrating circuits at millimeter wave frequencies using silicon technologies, i.e., system-on-a-chip. However, at frequencies beyond 10 GHz, the applications of silicon based technologies have been largely hindered by the lossy substrate, which results in large parasitic capacitances and high losses in on-chip passive components. The CMOS technologies developed in the last few years present a cost-effective option to realize highly integrated systems combining analog, microwave design techniques, transmission lines and other passive components such as a coupler.

Branchline couplers are used in microwave integrated circuits (MICs), such as balanced mixers, balanced amplifiers and reflection type phase shifters. Conventional couplers tend to consume expensive chip area, especially at low frequencies, thus many efforts have been made to reduce their size. Lumped-element hybrid couplers are ready examples of the attempt to miniaturize couplers, but lumped inductors and capacitors with the required values and high quality factors are not always available for use in MICs. Slow-wave transmission lines are also promising candidates for size reduction.

SUMMARY

In aspects of the invention, a branchline coupler structure using slow wave transmission line effect has both large inductance and large capacitance per unit length. The branchline coupler structure includes a plurality of quarter-wavelength transmission lines, at least one of which includes a high impedance arm and a low impedance arm. A high impedance of the high impedance arm is relative to a low impedance of the low impedance arm. The high impedance arm includes a plurality of narrow cells and having an inductance of nL and a capacitance of C/n, and the low impedance arm includes a plurality of wide cells and having an inductance of L/n and capacitance of nC. The wide and narrow cells are relative to each other, and the wide and narrow cells are adjacent each other to form a signal layer having step discontinuous alternative widths.

In aspects of the invention, a transmission line for a branchline coupler structure comprises a signal layer having alternating first and second widths, a ground plane, and a plurality of metal strips arranged above the ground plane. The signal layer is arranged above the metal strips such that the first widths are located over the metal strips and the second widths are located over the ground plane and between the metal strips.

In aspects of the invention, a method for slowing wave transmission of a signal comprises coupling the signal to a first quarter-wavelength transmission line comprising a first high impedance arm and a first low impedance arm, and coupling the signal to a second quarter-wavelength transmission line having a second high impedance arm and a second low impedance arm. Each of the first and second quarter-wavelength transmission lines includes a signal layer having step discontinuous alternative widths.

Accordingly, there exists a need in the art to overcome the deficiencies and limitations described hereinabove.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to an on-chip branchline coupler, and in particular to an on-chip branchline coupler on slow wave structures with CMOS fabrication technology using multi-layer.

Embodiments of the invention are directed to an on-chip branchline coupler on slow wave structures with CMOS fabrication technology using multi-layer structures. In particular, a current transmission line model can be used for the design of such a slow wave structure.

According to embodiments of the invention, a novel on-chip compact branchline coupler has a slow wave structure and a special multi-layer structure. The structure includes a discontinuous transmission line with metal strips crossing below the signal line. Further, embodiments of the coupler have a more compact size when compared with current traditional structure, e.g., the area can be reduced up to 50%.

Further embodiments of the invention are directed to an ideal on-chip compact branchline coupler using current process technologies, e.g., IBM process technologies. The coupler can include four arms, in which each arm is built as a slow wave transmission line. The slow wave transmission line can be built or formed with a transmission line having steps and metal strips cross under the signal line. The branchline coupler can be built with a multi-layer structure.

Figure 1:
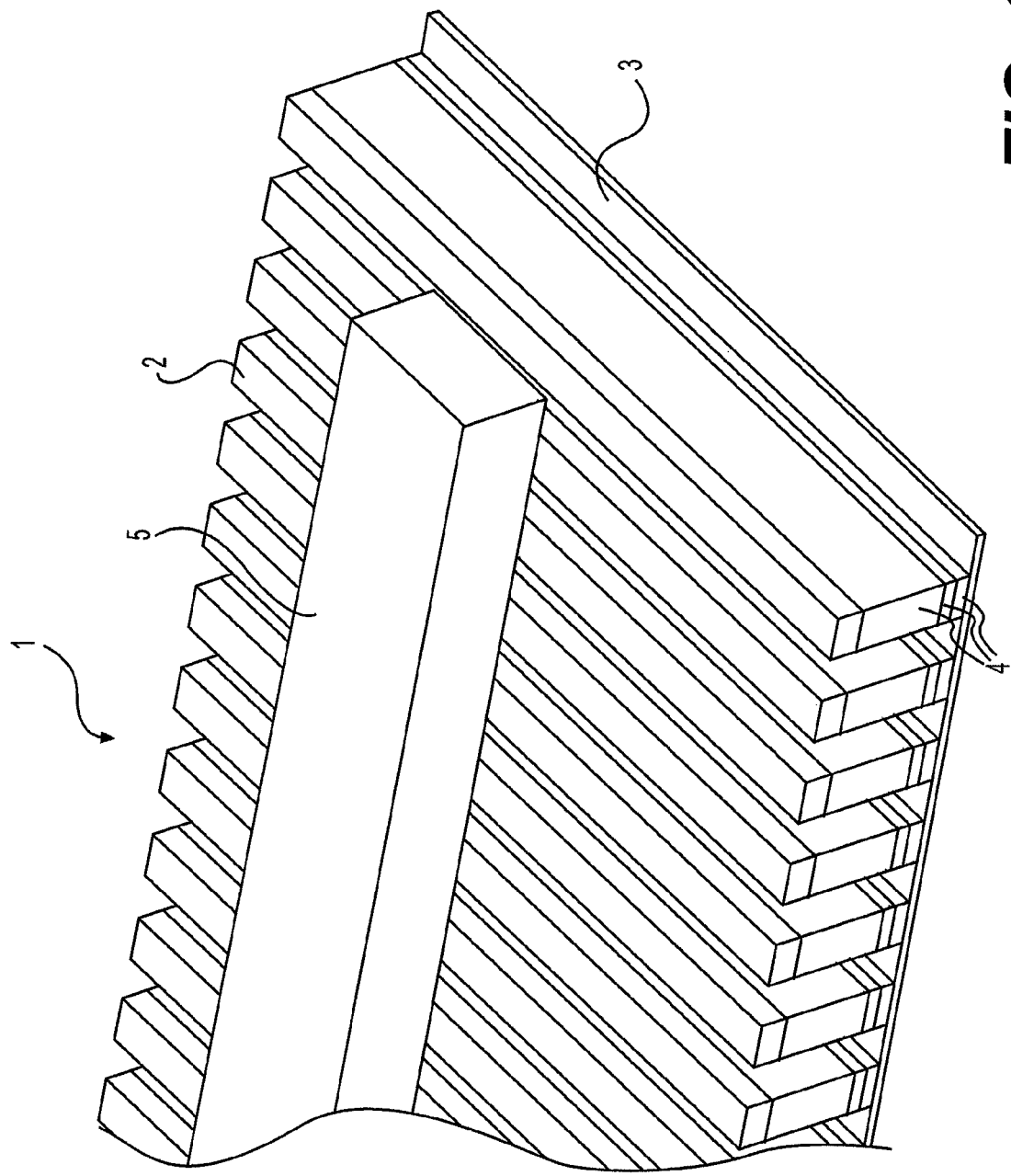
FIG. 1 illustrates a conventional slow wave microstrip line.
Figure 2:
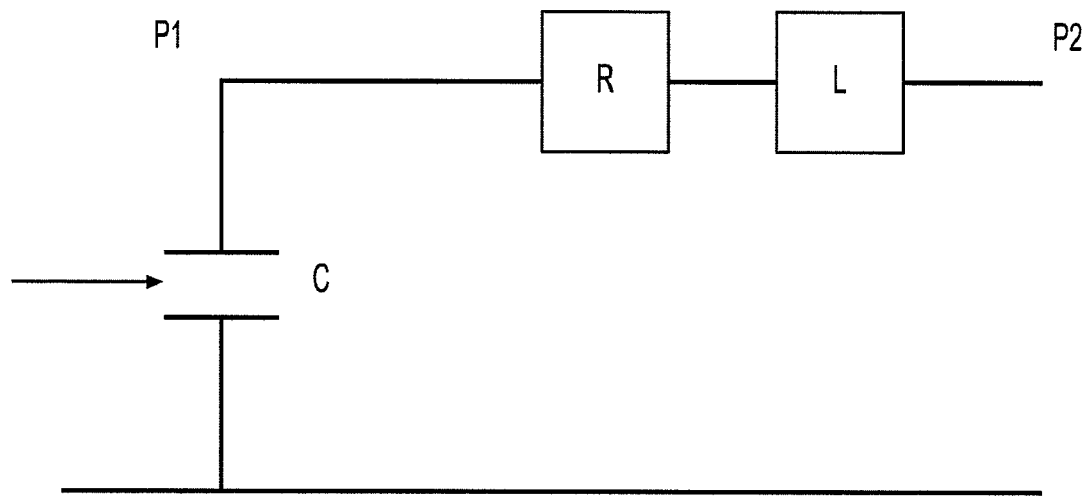
FIG. 2 illustrates an equivalent circuit corresponding to the microstrip line depicted in FIG. 1.

FIG. 1 illustrates a partial view of a transmission line of a conventional slow wave microstrip line 1. Slow wave microstrip line transmission line 1 includes a signal layer 5 having a constant width over its length positioned over a number of metal strips 2 formed over a ground plane 3. At least one via 4 can be arranged to connect metal strips 2 to ground plane 3. Signal layer 5 is arranged over metal strips 2 to carry a signal to be slowed. Slow wave microstrip line transmission line 1 can be schematically illustrated as shown in FIG. 2 as an RLC (Resistance, Inductance, and Capacitance) circuit. From this circuit it is known that v (is proportional to) $1/(LC)^{1/2}$, and the wavelength $\lambda$ can be determined from the equation $\lambda = v/f$, where v is velocity of the propagating signal and f is the signal strength.

Figure 3:
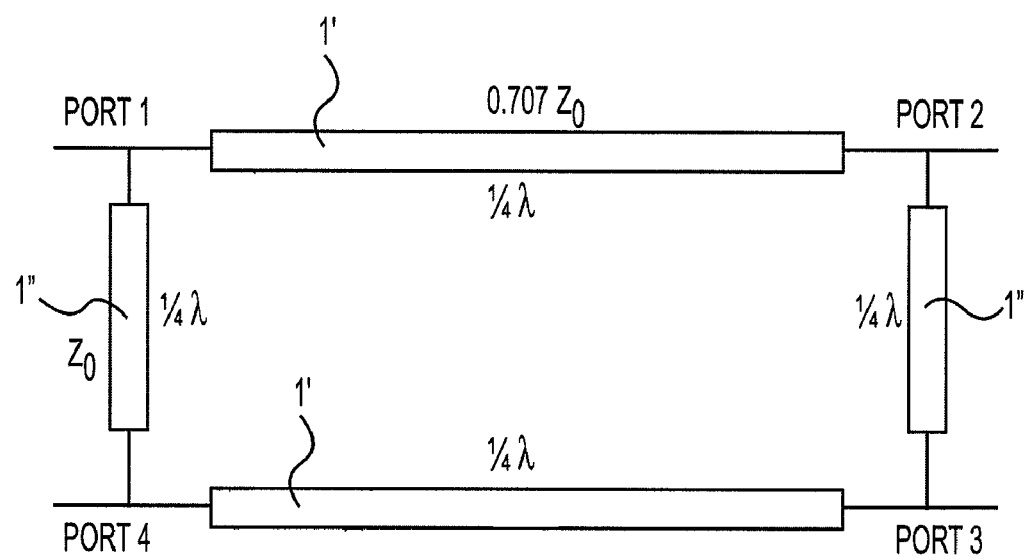
FIG. 3 schematically illustrates a conventional branchline coupler.

While FIG. 1 illustrates a part of an arm of slow wave microstrip line 1, FIG. 3 schematically illustrates the conventional branchline coupler. Each transmission line 1' and 1'' can be, e.g., a ¼$\lambda$ (quarter wavelength), but other wavelengths, such as ¾, ⁵⁄₄, ⁷⁄₄ wavelengths, etc., are also conceivable without departing from the spirit and scope of the embodiments of the invention. Port 1 is an input for an input signal, while port 2 and port 3 are output ports. Port 4 is an isolation port. Transmission lines 1' have lower impedance than transmission lines 1'', e.g., the impedance of transmission lines 1' is equal to 0.707 times the impedance of transmission lines 1''. By way of non-limiting example, the physical length of transmission line 1' can be reduced as the wavelength is reduced/slowed.

Figure 4:
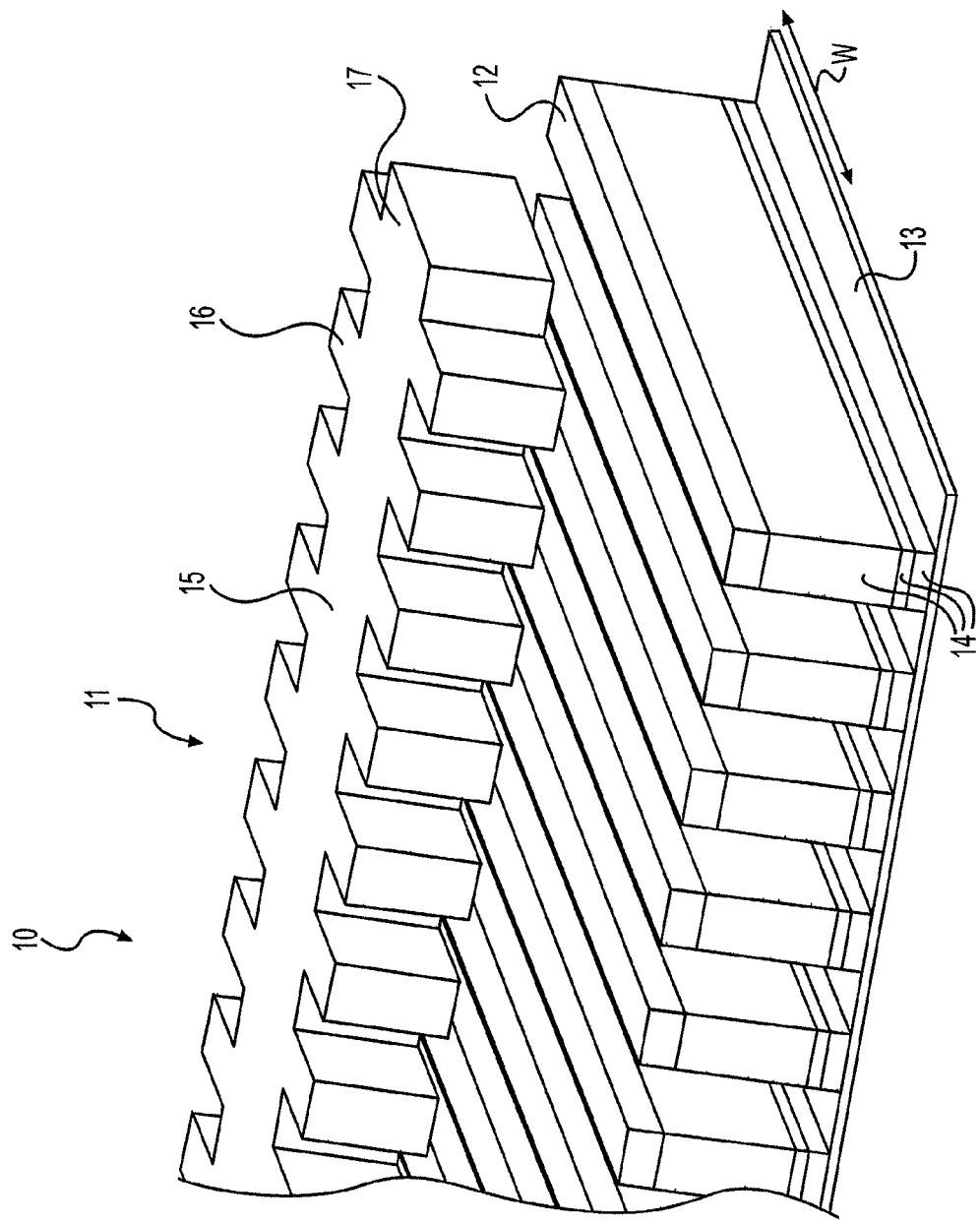
FIG. 4 illustrates a slow wave transmission line according to embodiments of the invention.
Figure 5:
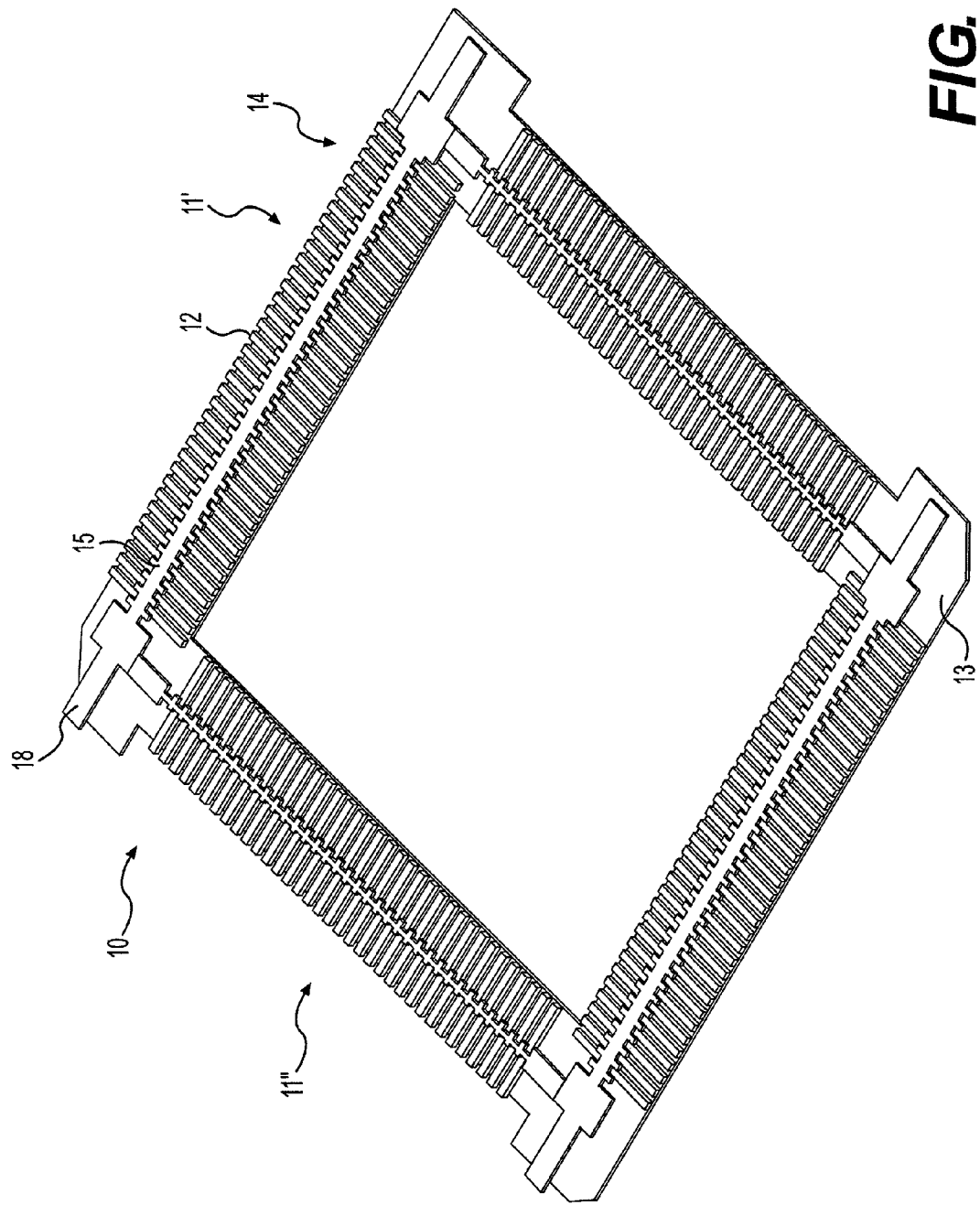
FIG. 5 illustrates a branchline coupler according to embodiments of the invention.

FIG. 4 illustrates a part of an arm of a branchline coupler 10 formed with a microstrip design according to embodiments of the invention. Branchline coupler 10 includes a signal layer 15, e.g., a single signal layer, built with slow wave transmission lines (or arms) 11 with step discontinuity having alternating widths. Portions of transmission lines 11 (referred to as "cells") having a wider extent (in a width direction W) 16 are formed over metal strips 12, e.g., copper, aluminum, or other suitable metal, coupled to a ground plane 13 through vias 14, which can be, e.g., formed of copper, aluminum or other suitable metal, while other portions (cells) of transmission line 11 having a narrower extent (in the width direction) 17 are formed over ground plane 13. In this manner, the slow wave transmission line 11 includes floating metal strips 12 crossing under the stepped signal line 15. Preferably, wider cells 16 are positioned over floating metal strips 12, while narrow cells 17 are positioned between metal strips 12 and directly over ground plane 13. FIG. 5 illustrates an exemplary embodiment of branchline coupler 10, which includes four quarter wavelength transmission lines 11' and 11'', which have an impedance of 35Ω and 50Ω, respectively. Further, ports 18 couple an arm 11' to an arm 11''. The dimension of coupler 10 can be dramatically reduced if the wavelength can be smaller. By way of non-limiting example, signal layer 15 can be arranged, e.g., 1-50 μm above ground plane 13, and positioned, e.g., 1-20 μm above metal strips 12, which are supported on one or more vias 14 above ground plane 13.

Figure 6:
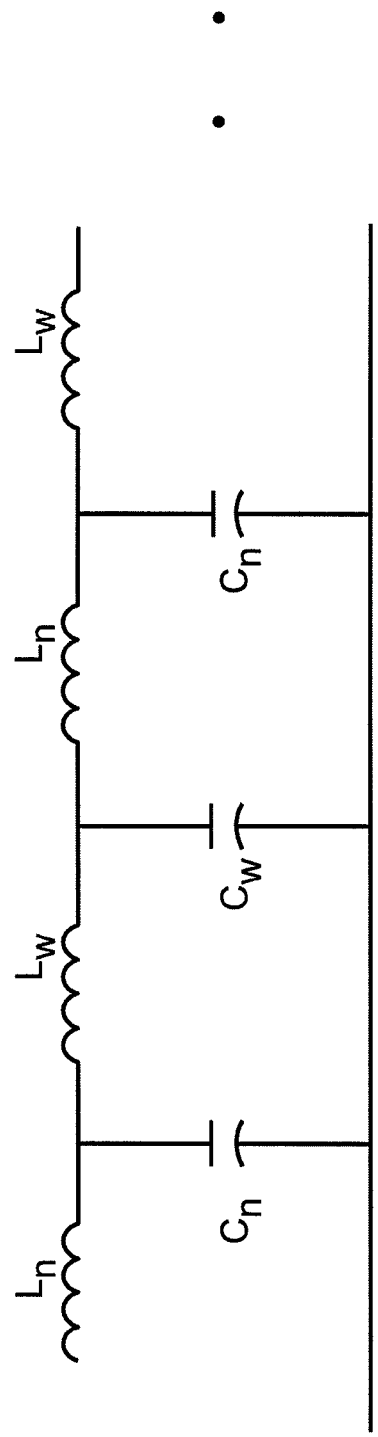
FIG. 6 illustrates an equivalent circuit corresponding to the microstrip line depicted in FIG. 4.

The wavelength can be made smaller while the characteristic impedance is kept unchanged by increasing L and C with a same ratio. Both inductance and capacitance of the microstrip are related to line width, i.e., inductance increases with decreasing line width, while capacitance increases with increasing line width. As shown in FIG. 4, transmission lines 11' and 11'' are provided with alternating sections (or cells) that are formed through step discontinuities. Each cell or section can be approximated by an L-C lumped element model, as shown in FIG. 6. In the approximated model, $L_w$ and $C_w$ respectively represent the line inductance and capacitance of the section including wider cells 16, while $L_n$ and $C_n$ respectively represent the line inductance and capacitance of the section including narrow cells 17. Each transmission line 11' or 11'' has high and low impedance sections. As illustrated in FIG. 4, the high impedance section is formed with the narrower cells 17 arranged directly over ground plane 13, and is designed to have line inductance nL and line capacitance C/n. In this way, the characteristic impedance of the high impedance section is higher by a factor of $n^2$ than the low impedance section formed by wider cells 16 arranged over floating metal strips 12, which is designed with a line inductance L/n and line capacitance nC. In the physical layout of the transmission line, higher inductance requires more distance between the signal and ground paths, which reduces line capacitance. When the two sections are cascaded together according to embodiments of the invention, the series inductance is dominated by the high impedance section, while the capacitance is dominated by the low impedance section. This causes a simultaneous increase of the both L and C, resulting in an increased delay of the signal.

Figure 7:
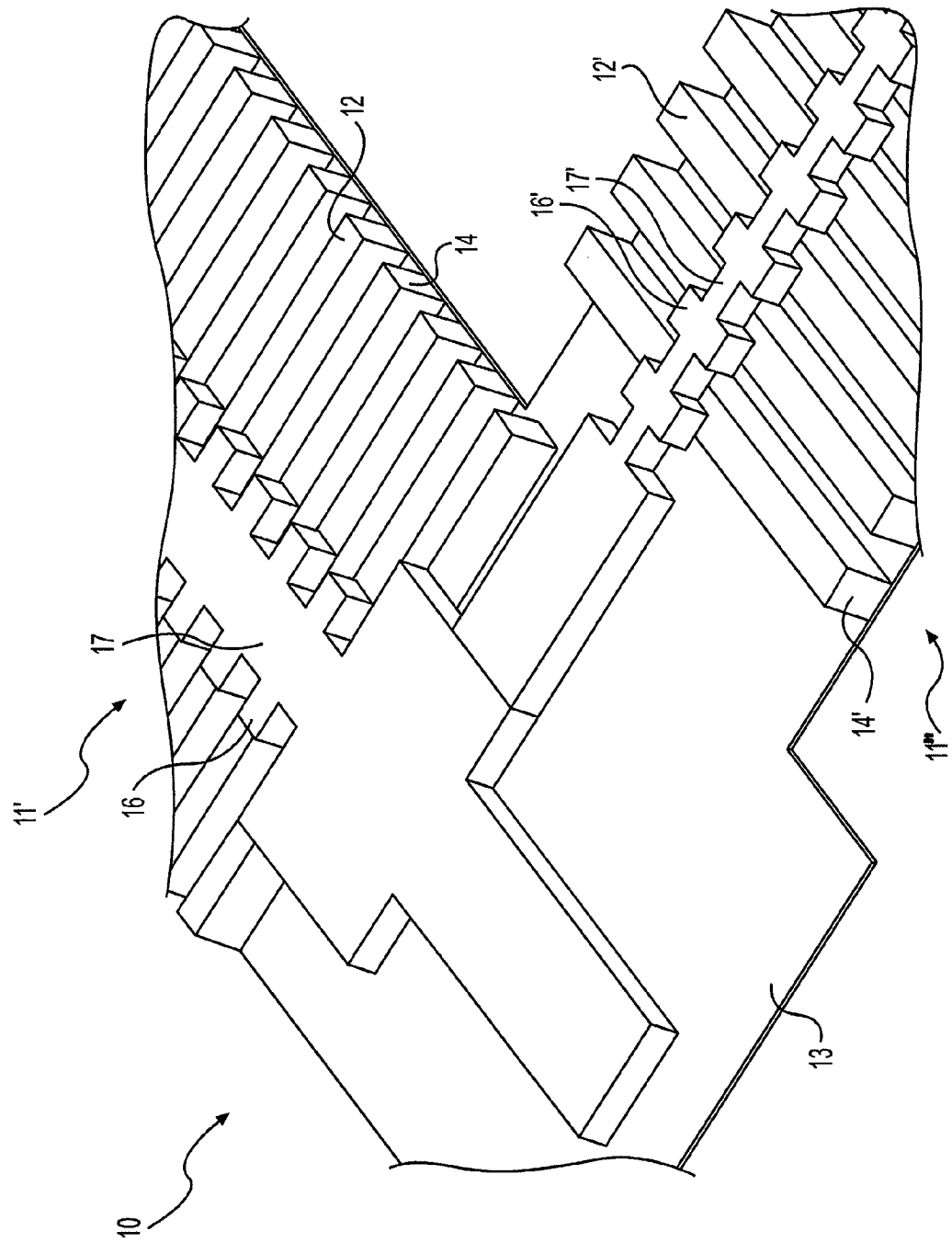
FIG. 7 illustrates a portion of the branchline coupler according to embodiments of the invention.

FIG. 7 illustrates in greater detail a corner of the branchline coupler 10 depicted in FIG. 5. As shown in this exemplary embodiment, the arms 11' and 11'' of coupler 10 are built using the step discontinuity slow wave transmission line discussed above in FIG. 4. Transmission line 11', which can have an overall impedance of, e.g., a 35Ω, includes a number of different cells 16 and 17 that are arranged together, as described above. While in the illustrated exemplary embodiment the cells can be (or can have a pitch of) 6 μm long, other lengths, greater than or less than 6 μm, can be utilized without departing from the spirit and scope of embodiments of the invention. By way of example, increasing the number of metal strips (i.e., decreasing pitch) slows transmission, whereas increasing pitch increases component size and increases transmission speed. Cells 16 and 17 are alternatingly arranged along the length of transmission line 11'. Each cell 17 forms a high impedance arm of transmission line 11' that includes a 10 μm wide layer with 13 as ground, while each cell 16 forms a low impedance arm of transmission line 11' that includes a 22 μm wide layer with metal layer 12 as ground layer. Transmission line 11'', which can have a higher overall impedance than transmission line 11', e.g., a 50Ω, also includes a number of different cells 16' and 17'. While transmission line 11'' can include a different number of cells than transmission line 11', cells 16' and 17' are alternatingly arranged along the length of the transmission line 11''. In the instant example, the length of 6 μm may be utilized for ease of explanation, but it is understood that the disclosure of this exemplary value should not be construed as limiting the embodiments of the invention. In the exemplary embodiment, the width dimensions of the cells 16' and 17' are decreased relative to cells 16 and 17 of the 35Ω transmission line 11'. Each cell 17' forms a high impedance arm of transmission line 11'' that includes a 4 μm wide layer with 13 as ground, while each cell 16' forms a low impedance arm of transmission line 11'' that includes as a 10 μm wide layer with metal layer 12 as ground layer. Transmission lines 11' and 11" can be coupled to port 18, which can be, e.g., an input port, an output port, or an isolation port. Further, as noted above, the impedance of transmission line 11' can be a function of the impedance ($Z_O$) of transmission line 11", e.g., 0.707 $Z_O$. Moreover, the low impedance arms of the transmission lines can also be functions of their respective high impedance arms. In this regard, it is noted that the impedance of each transmission line depends upon the dimensions of the cells forming the high and low impedance arms of the transmission line. Further, it is understood that different impedances and different functions can be contemplated without departing from the spirit and scope of embodiments of the invention.

In semiconductor technology, the high impedance arm of the signal layer according to embodiments of the invention can be constructed with narrow layer 17 and 17' opposite or above ground layer 13. The higher distance between the signal layer 15 and ground path provides relative large inductance, while the narrow signal width increases the inductance at the same time. The low impedance arm of the signal layer can be constructed with wide layer 16 and 16' positioned opposite or above metal layer 12 as a ground layer since metal layer 12 is connected to ground layer 13 through vias 14. This shorter distance between the signal layer and ground path provides relative larger capacitance, and the wide signal width increases the capacitance at the same time. Thus, the exemplary embodiment provides larger L and C increasing ratio comparing with current existing slow wave structures, so it will reduce the size of the passive components even more. The proposed coupler has the dimension of about 300 μm×300 μm, which is about 2.5 times smaller than the conventional design using CMOS technology.

Figure 8A:
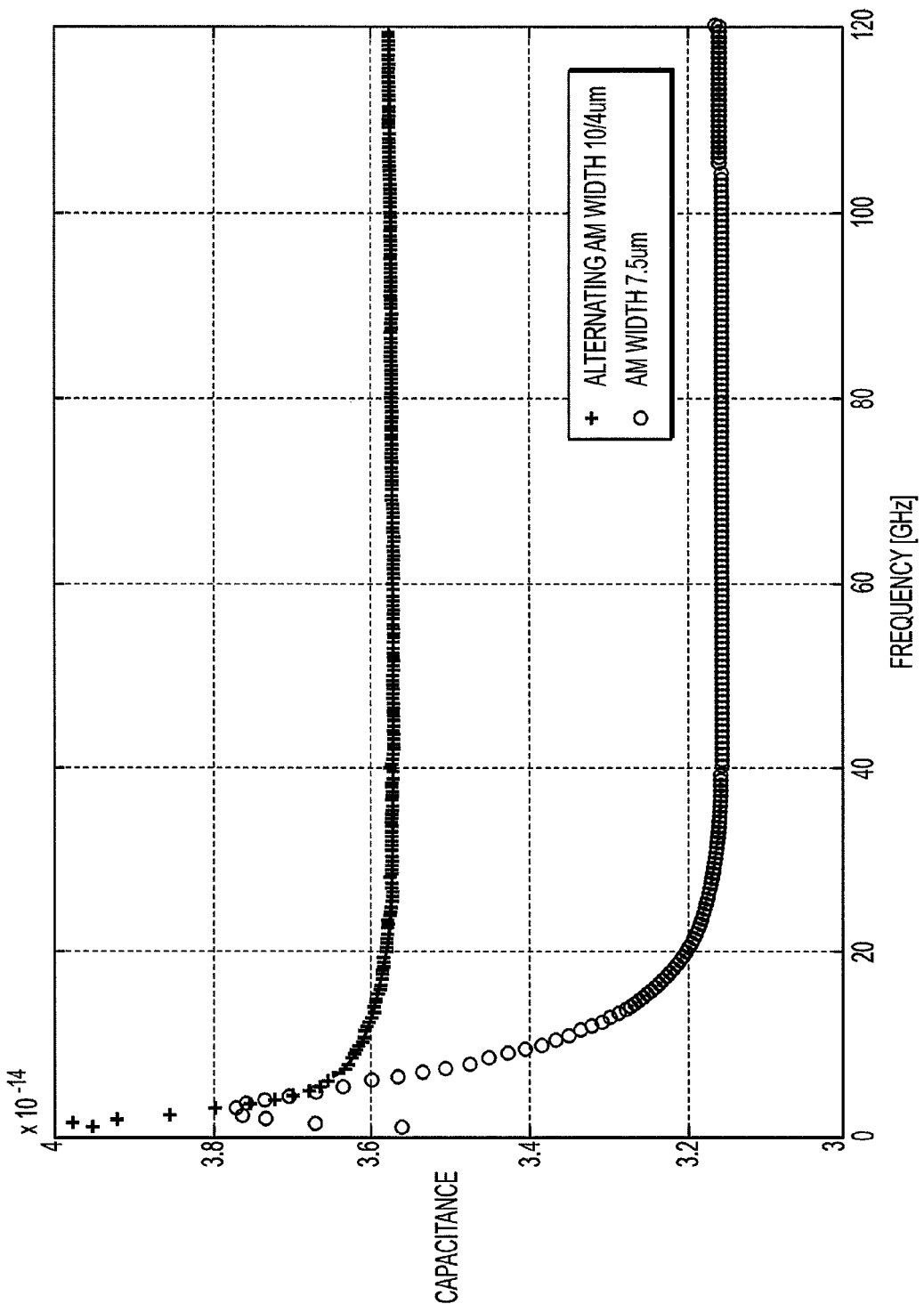
FIGS. 8a and 8b graphically compare the conventional slow wave microstrip line to the slow wave microstrip line according to embodiments of the invention.
Figure 8B:
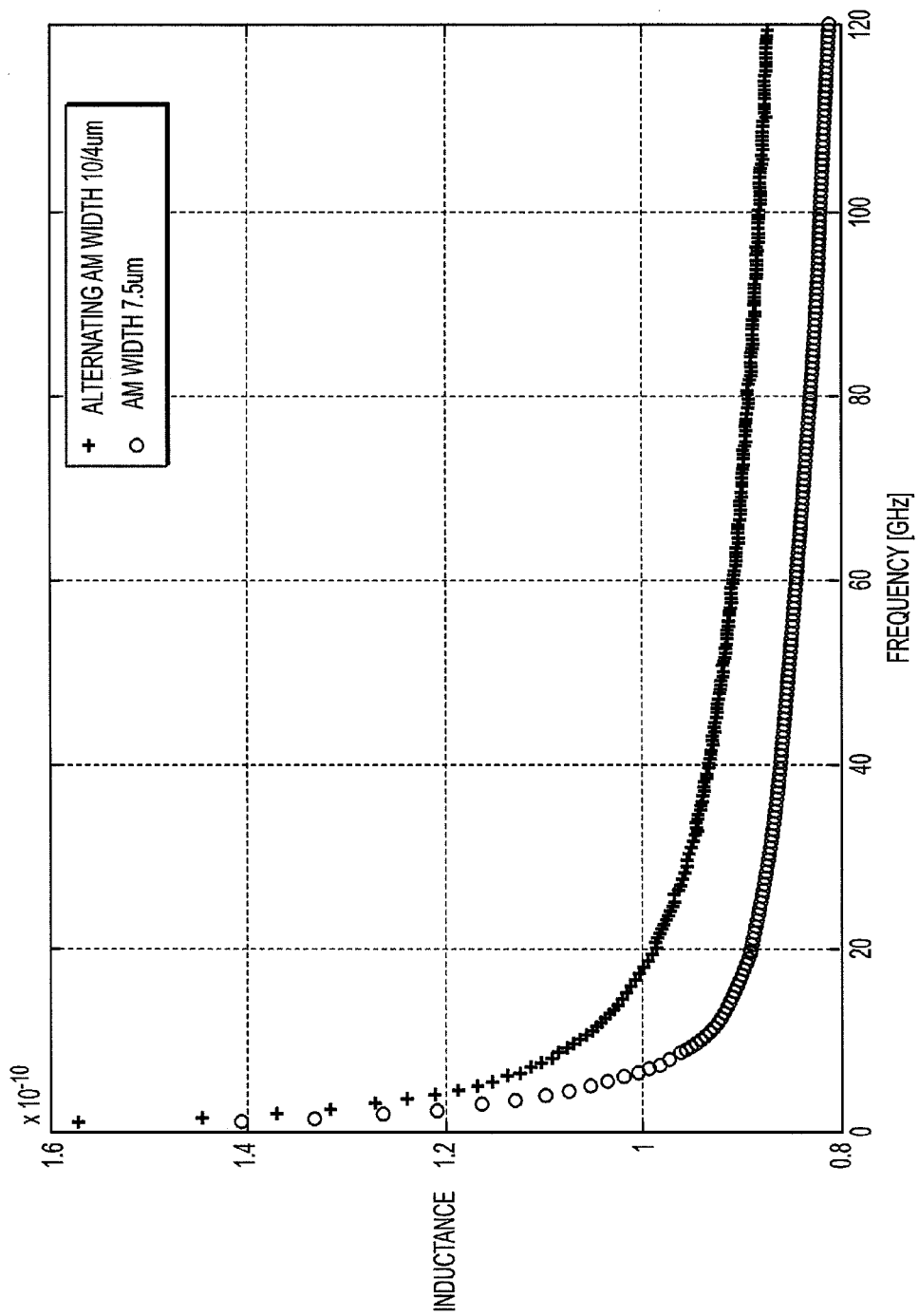
Figure 9A:
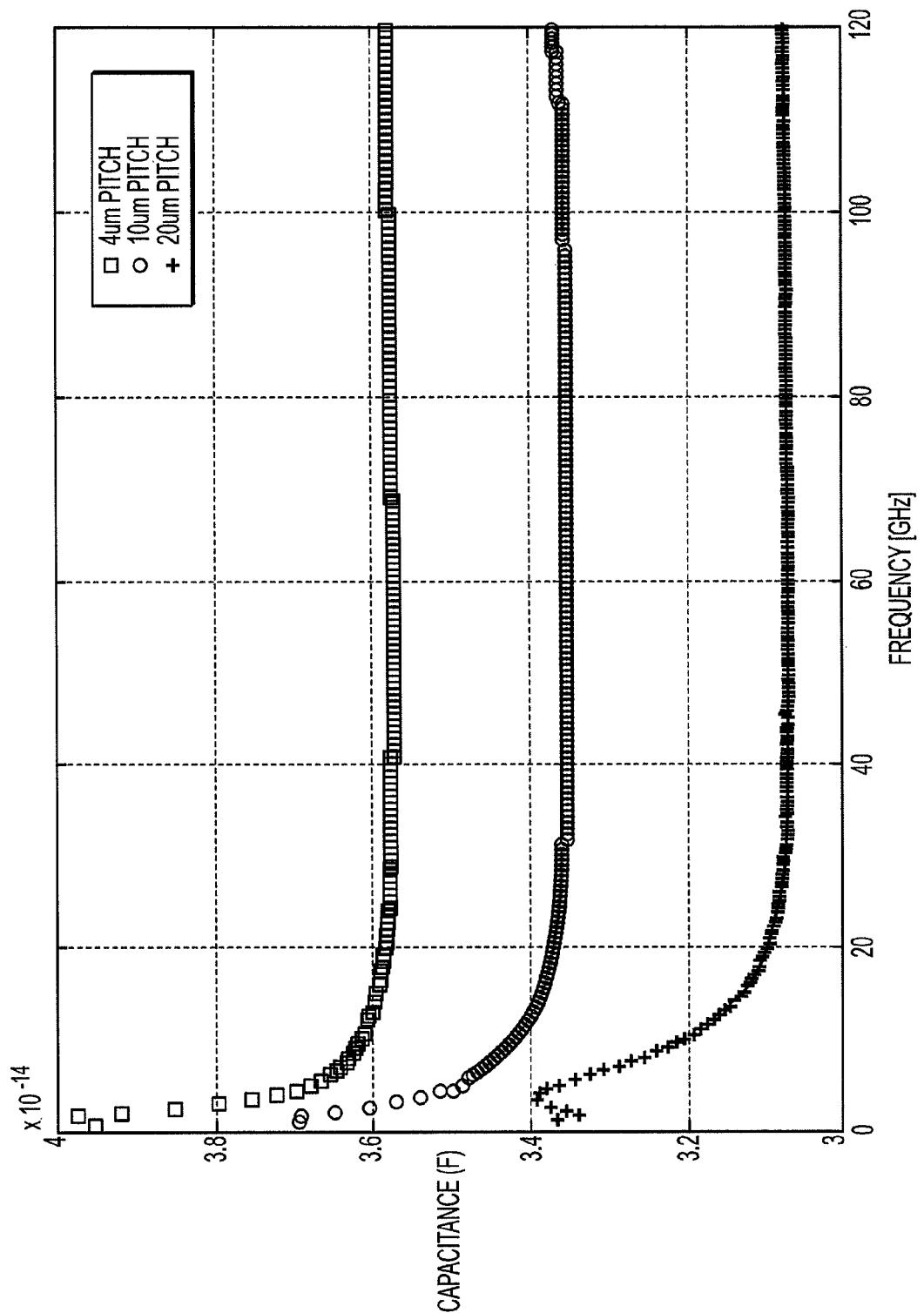
FIGS. 9a and 9b graphically compare different pitch lengths with the slow wave microstrip line according to embodiments of the invention.
Figure 9B:
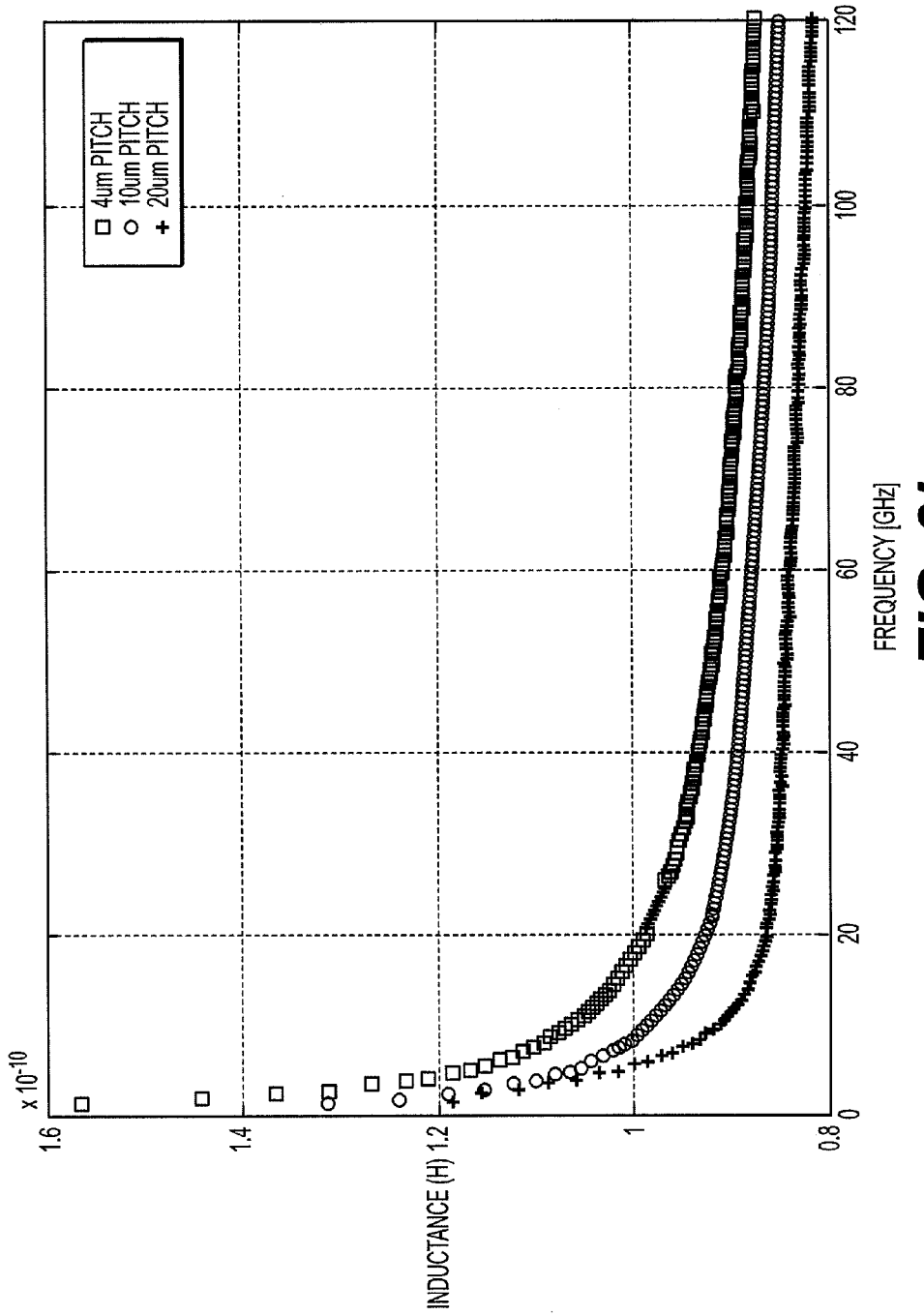

By this stepped design of the signal layer, both the L and C in the formed transmission lines are increased simultaneously as compared to the conventional design having a constant width signal layer. These increases are graphically illustrated in FIGS. 8a and 8b, where FIG. 8a depicts the higher capacitance, while FIG. 8b depicts the higher inductance. Thus, these figures graphically illustrate that the slow wave effect can be improved through step discontinuity structure of the signal layer in accordance with embodiments of the invention. Further, as noted above, the exemplary embodiment shown in FIG. 7 utilized a cell length or pitch of 6 μm, but it was noted that other lengths or pitches could be utilized without departing from the spirit and scope of the invention. FIGS. 9a and 9b graphically illustrate a comparison of the capacitance (FIG. 9a) and inductance (FIG. 9b) for various pitches, i.e., 4 μm, 10 μm, and 20 μm, of a stepped signal layer structure having wide cells of 10 μm and narrow cells of 4 μm, which corresponds to the high impedance transmission line 11" of FIG. 7. Thus, these figures show that the smaller the pitch, the better the slow wave effect.

Figure 10:
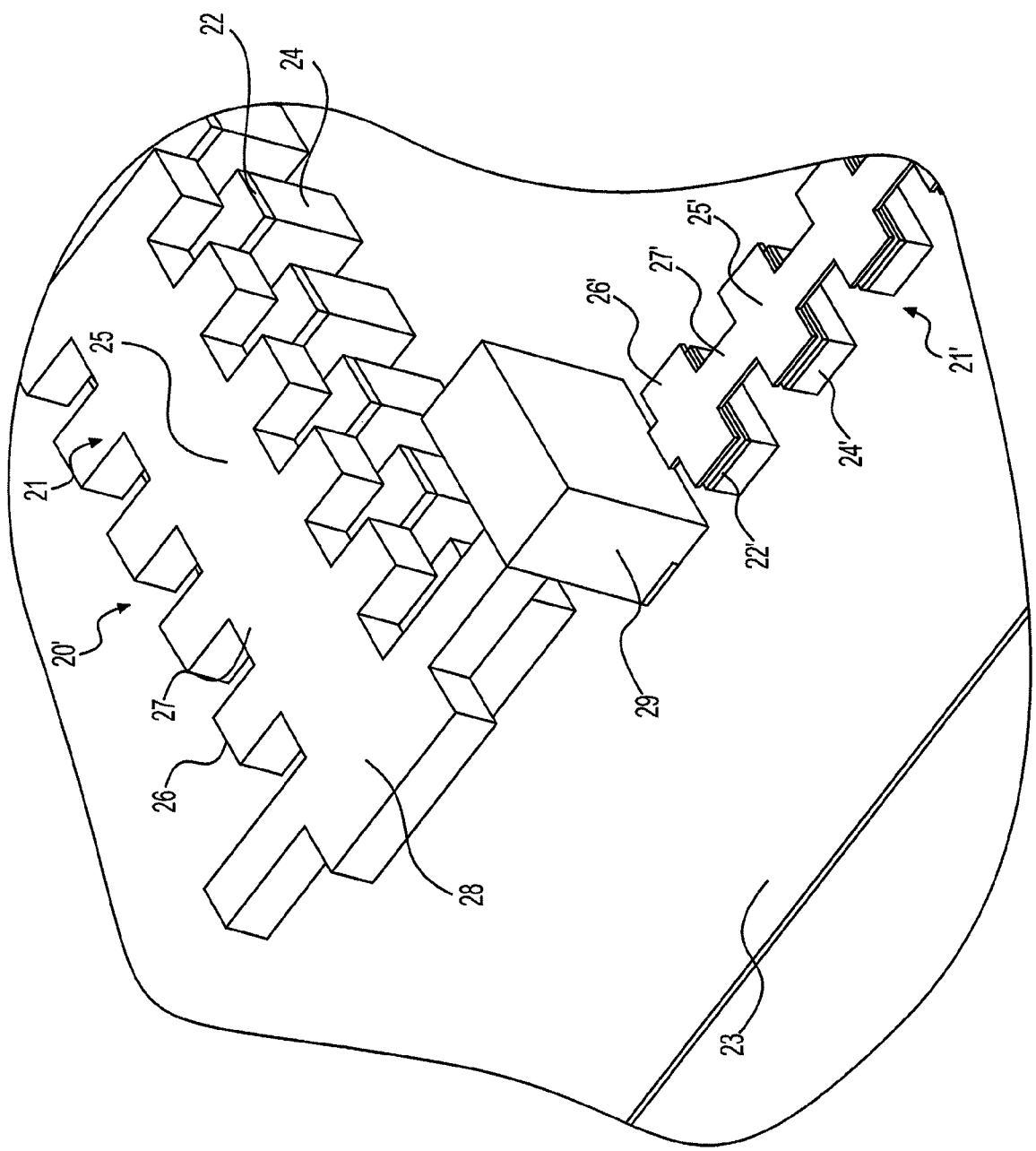
FIG. 10 illustrates a portion of an alternative branchline coupler according to embodiments of the invention.

FIG. 10 illustrates a portion of an alternative embodiment of the branchline coupler 20 for a multi-signal layer. While this figure only illustrates a portion of the alternative branchline coupler 20, one ordinarily skilled in the art will readily understand its structure and operation from the foregoing and following description of embodiments of the invention. In contrast to the portion of branchline coupler 10 depicted in FIG. 7, this embodiment utilizes signal layers located at different heights relative to ground plane 23. Like the FIG. 7 embodiment, the signal layers of coupler 20 are built as step discontinuity slow wave transmission lines 21, 21'. The 35Ω transmission line 21 includes a high impedance arm and a low impedance arm formed by a number of different cells 26 and 27, which can be, e.g., 6 μm long, that are alternatingly arranged along the length of transmission line 21. The high impedance arm is formed by narrow cells 27, and each cell 27 is formed as a 10 μm wide layer with 23 as ground, while the low impedance arm is formed by wide cells 26, and each cell 26 is formed as a 22 μm wide layer with metal layer 12 as ground layer. The 50Ω transmission line 21' can also be formed with different cells 26' and 27', which can be, e.g., 6 μm long, that are alternatingly arranged along the length of transmission line 21'. As generally discussed above, the width dimensions of the cells 26' and 27' in transmission line 21' can be decreased, relative to the cells of the 35Ω transmission line 21, in order to achieve the higher $Z_O$ impedance of 50Ω in transmission line 21'. The high impedance arm of transmission line 21' is formed by narrow cells 27', and each cell 27' includes a 4 μm wide layer with 23 as ground, which the low impedance arm of transmission line 21' is formed by wide cells 26', and each cell 26' includes a 10 μm wide layer with metal layer 22' as ground layer. As illustrated, metal layer 22, which can include vias 24, can be located at a different height, relative to ground plane 23, than metal layer 22', which can also include vias 24'. Because of this difference in height, a coupling device 29 is arranged to couple the two different layers to port 28.

Figure 11:
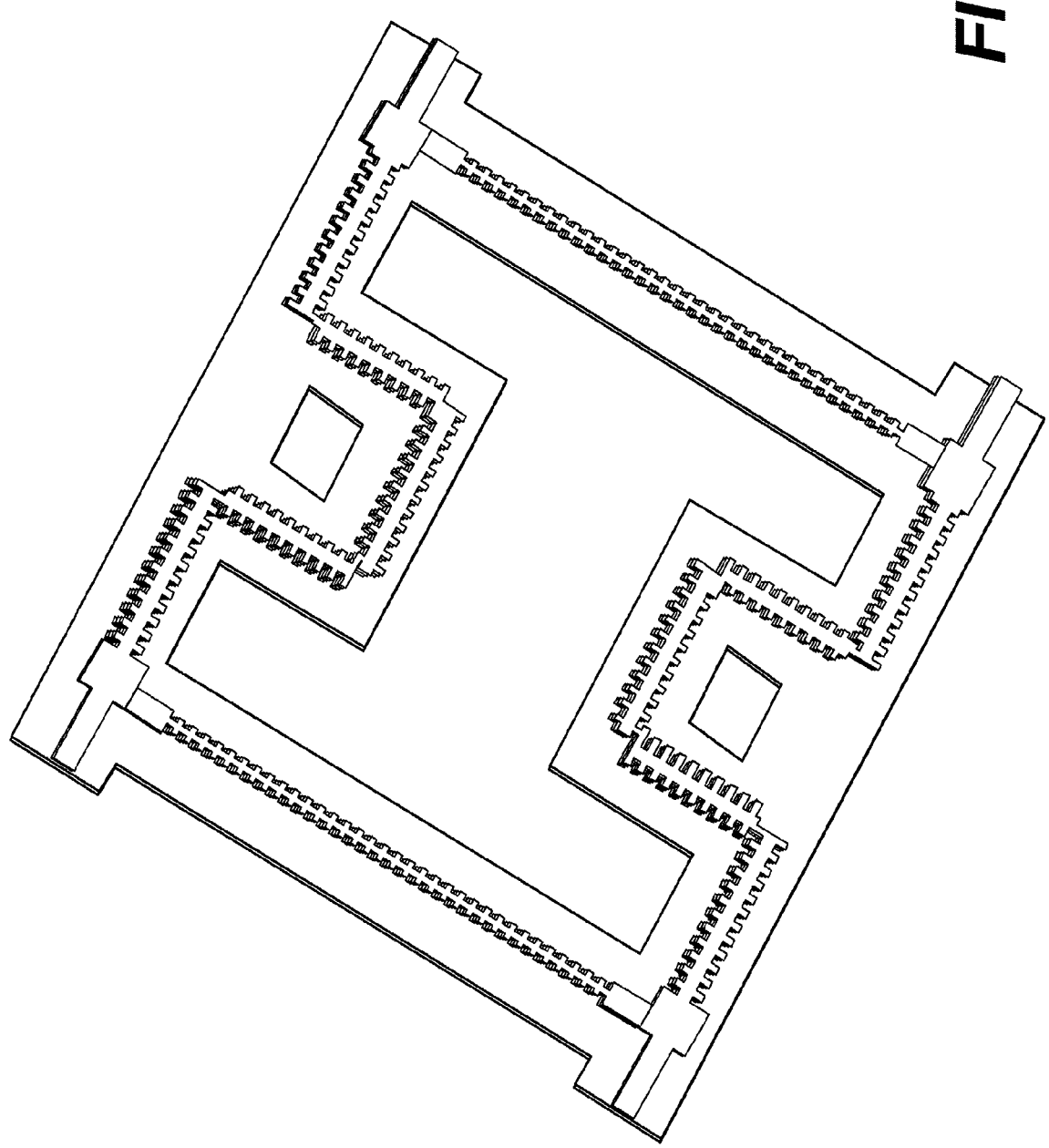
FIG. 11 illustrates a portion of another alternative branchline coupler according to embodiments of the invention.

FIG. 11 illustrates another alternative embodiment of branchline coupler 30 having a folded structure in order to reduce the size of the component. In contrast to the previously described branchline couplers 10 and 20, branchline coupler 30 utilizes arms 31 formed with meanderlines including folds or bends in the arms. While the exemplary illustration only shows two transmission lines of coupler 30 provided with meanderlines and only one fold is shown, it is understood that each transmission line can be formed with meanderlines and multiple folds or bends in order to reduce the size of the components. Coupler 30 utilizes the step discontinuity slow wave transmission line formed of high and low impedance arms as described above in conjunction with the meanderlines and folds in the arm without departing from the spirit and scope of the embodiments of the invention.

Further, the couplers according to the embodiments of the invention can be built or formed with parameterized cell. The parameterized cell can include the signal layer, the ground layer, pitch, horizontal arm signal layer width I, horizontal arm signal layer width II, vertical arm signal layer width I, vertical arm signal layer width II, crossunder layer, crossover layer, and design frequency. Further, in the parameterized cell, the port length and length of the T-junction can be fixed parameters. However, ground width, the length of each arm (e.g., number of steps), width of the T-junction can be calculated according to input parameters for the coupler. Moreover, it is understood that this information can be provide or stored in a library of a design environment in order to build the couplers according to a predefined model.

Embodiments of the invention provide a compact quarter-wavelength 3 dB branch line coupler that achieves a significant size reduction while maintaining MIC and MMIC process compatibility with standard BiCMOS technology.

Moreover, it is understood that the embodiments of the invention are not limited to branchline couplers, and that the subject matter of the embodiments can also be utilized in other passive component designs, which include, but are not limited to, power dividers, combiners, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A branchline coupler structure using slow wave transmission line effect having both large inductance and large capacitance per unit length, the branchline coupler structure comprising:
   a plurality of quarter-wavelength transmission lines, at least one of which comprises a high impedance arm and a low impedance arm, wherein a high impedance of the high impedance arm is relative to a low impedance of the low impedance arm;
   the high impedance arm comprising a plurality of narrow cells and having an inductance of nL and a capacitance of C/n; and
   the low impedance arm comprising a plurality of wide cells and having an inductance of L/n and capacitance of nC, wherein:
      the wide and narrow cells are relative to each other, and the wide and narrow cells are adjacent each other to form a signal layer having step discontinuous alternative widths; and
      wide cells of the low impedance arm comprise portions of the signal layer having widths wider than the narrow cells that are arranged over floating metal strips and the narrow cells of the high impedance arm comprises portions of the signal layer having widths narrower than the wide cells that are arranged over a ground plane.

2. The branchline coupler in accordance with claim 1, wherein at least two of the plurality of transmission lines comprise high impedance arms and low impedance arms, and wherein a first of the at least two transmission lines has an impedance of about 50 ohms and a second of the at least two transmission lines has an impedance of about 35 ohms.

3. The branchline coupler in accordance with claim 2, wherein the step discontinuous alternative widths in the signal layer of the first transmission line differ from the step discontinuous alternative widths of the signal layer of the second transmission line.

4. The branchline coupler in accordance with claim 3, wherein the step discontinuous alternative widths of the signal layer are narrower in the first transmission line than in the second transmission line.

5. The branchline coupler in accordance with claim 1, wherein the floating metal strips are coupled to the ground plane through at least one via.

6. The branchline coupler in accordance with claim 1, wherein the plurality of wide cells of the low impedance arm has a width of 10 um, and wherein the plurality of narrow cells of the high impedance arm has a width of 4 um.

7. The branchline coupler in accordance with claim 1, wherein the plurality of wide cells of the low impedance arm has a width of 22 um, and wherein the plurality of narrow cells of the high impedance arm has a width of 10 um.

8. A branchline coupler structure using slow wave transmission line effect having both large inductance and large capacitance per unit length, the branchline coupler structure comprising:
   a plurality of quarter-wavelength transmission lines, at least one of which comprises a high impedance arm and a low impedance arm, wherein a high impedance of the high impedance arm is relative to a low impedance of the low impedance arm;
   the high impedance arm comprising a plurality of narrow cells and having an inductance of nL and a capacitance of C/n; and
   the low impedance arm comprising a plurality of wide cells and having an inductance of L/n and capacitance of nC, wherein:
      the wide and narrow cells are relative to each other, and the wide and narrow cells are adjacent each other to form a signal layer having step discontinuous alternative widths,
      at least two of the plurality of transmission lines comprise high impedance arms and a low impedance arms, and
      a first of the at least two transmission lines is located at a different height, relative to the ground plane, from a second of the at least two transmission lines.

9. The branchline coupler in accordance with claim 8, further comprising a connector arranged to couple the first transmission line and the second transmission line to a common port.

10. A transmission line for a branchline coupler structure comprising:
    a signal layer having alternating first and second widths;
    a ground plane;
    a plurality of metal strips arranged above the ground plane; and
    the signal layer being arranged above the metal strips such that the first widths are located over the metal strips and the second widths are located over the ground plane and between the metal strips.

11. The transmission line in accordance with claim 10, wherein the first widths are about 22 um and the second widths are about 10 um, whereby the transmission line has an impedance of about 35 ohms.

12. The transmission line in accordance with claim 11, wherein signal layer, ground plane, and metal strips are arranged to form a high impedance arm and a low impedance arm, and wherein the high impedance arm has an inductance of $nL$ and a capacitance of $C/n$, and the low impedance arm has an inductance of $L/n$ and capacitance of $nC$.

13. The transmission line in accordance with claim 10, wherein the first widths are about 10 um and the second widths are about 4 um, whereby the transmission line has an impedance of about 50 ohms.

14. The transmission line in accordance with claim 13, wherein the signal layer, ground plane, and metal strips are arranged to form a high impedance arm and a low impedance arm, and wherein the high impedance arm has an inductance of $nL$ and a capacitance of $C/n$, and the low impedance arm has an inductance of $L/n$ and capacitance of $nC$.

15. The transmission line in accordance with claim 10 being structured and arranged to be coupled to another transmission line as part of a branchline coupler.

16. The transmission line in accordance with claim 10 being structured and arranged to be coupled to another transmission line that is located at a different height, relative to the ground plane, than the transmission line.

17. The transmission line in accordance with claim 10, wherein the transmission line includes at least one fold to form a meanderline.

18. A method for slowing wave transmission of a signal, comprising:

coupling the signal to a first quarter-wavelength transmission line comprising a first high impedance arm and a first low impedance arm; and coupling the signal to a second quarter-wavelength transmission line having a second high impedance arm and a second low impedance arm, wherein:

each of the first and second quarter-wavelength transmission lines include a signal layer having step discontinuous alternative widths, the signal layer is arranged above a plurality of metal strips over a ground plane such that a first step of said step discontinuous alternative widths is located over the metal strips and a second step of said step discontinuous alternative widths is located over the ground plane and between the metal strips.

19. The method in accordance with claim 18, further comprising:

adjusting a pitch of the first and second quarter-wavelength transmission lines.

* * * * *